United States Patent [19]

Brown

[11] Patent Number: 4,578,736

[45] Date of Patent: Mar. 25, 1986

[54] SURFACE MOUNTED ELECTRICAL COMPONENTS AND METHOD OF FABRICATION

[75] Inventor: Donald R. Brown, Downers Grove, Ill.

[73] Assignee: AT&T Technologies, Inc., Berkeley Heights, N.J.

[21] Appl. No.: 645,194

[22] Filed: Aug. 28, 1984

[51] Int. Cl.⁴ .......................... H01G 1/14; H01G 7/00
[52] U.S. Cl. .................................... 361/306; 29/25.42
[58] Field of Search .................. 29/25.42, 832, 841, 29/854, 855, 856; 264/272.18; 361/321 C, 433 C, 306, 308, 309, 310, 402, 403, 404

[56] References Cited

U.S. PATENT DOCUMENTS

| | | | |
|---|---|---|---|
| 3,130,356 | 4/1964 | Weller | 317/261 |
| 3,550,228 | 12/1970 | Asscher | 29/25.42 |
| 4,004,200 | 1/1977 | Johanson | 361/310 |
| 4,333,213 | 6/1982 | Meal et al. | 29/25.42 |
| 4,346,429 | 8/1982 | De Matos | 361/310 |
| 4,365,396 | 12/1982 | Baba et al. | 29/854 X |

*Primary Examiner*—Donald A. Griffin
*Attorney, Agent, or Firm*—R. P. Miller; M. de Picciotto

[57] ABSTRACT

An electrical component (10) is encased in a housing (31) and is provided with pairs of terminals (24-26) which permit surface mounting on a printed circuit (36, 37, 38) in a number of different orientations. The terminals are blanked from a metal strip (21) to form T-shaped terminals (24-26, 54-56 and 74-76) which are subsequently bent about the housing to form a number of sets of terminal pairs.

11 Claims, 13 Drawing Figures

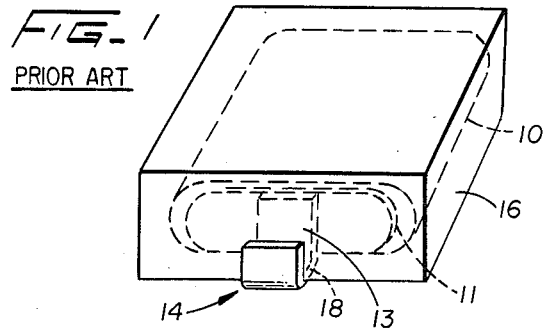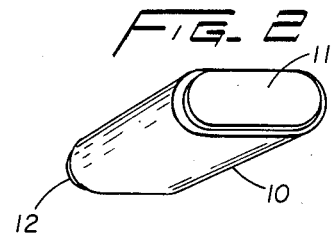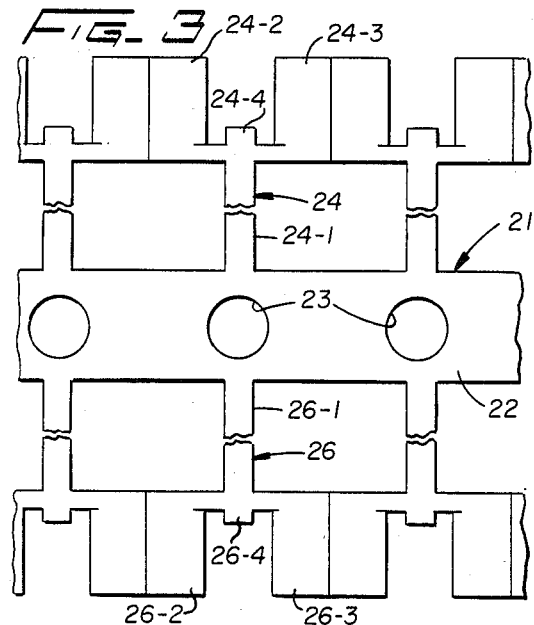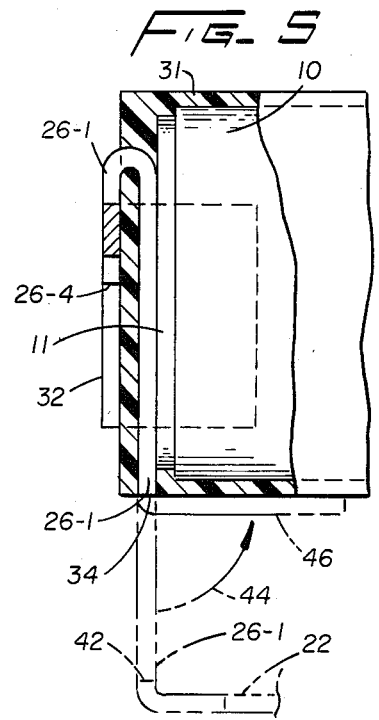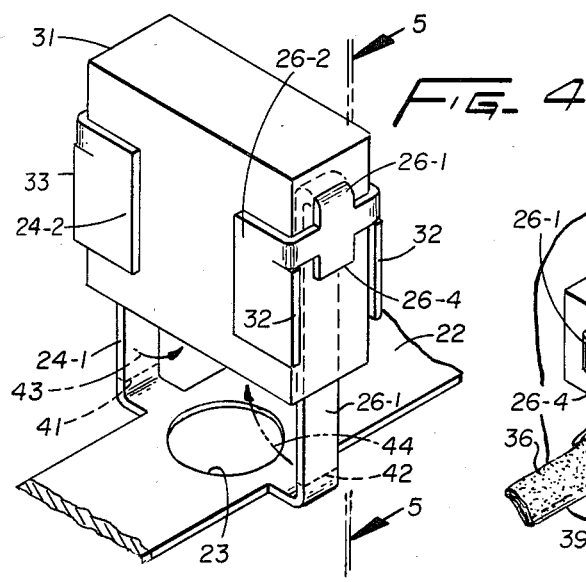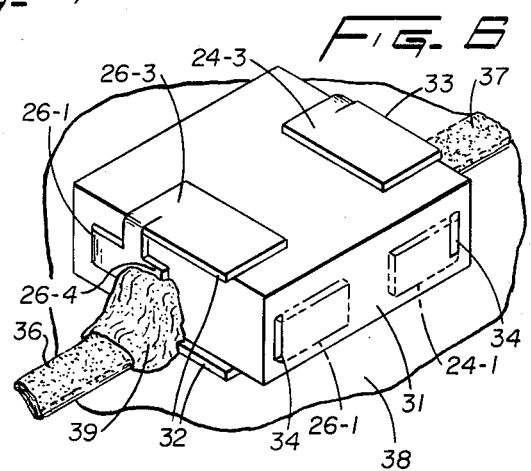

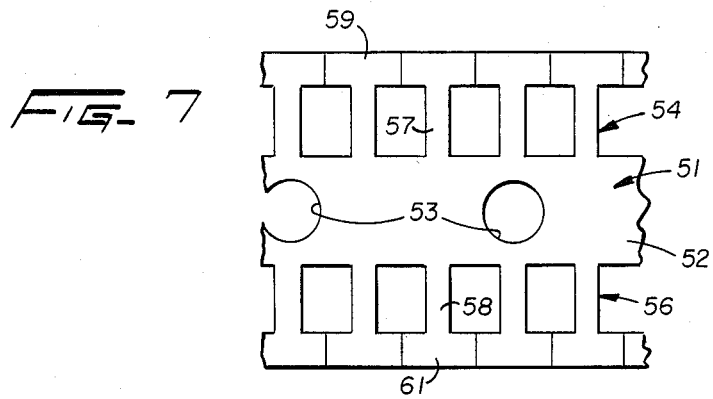
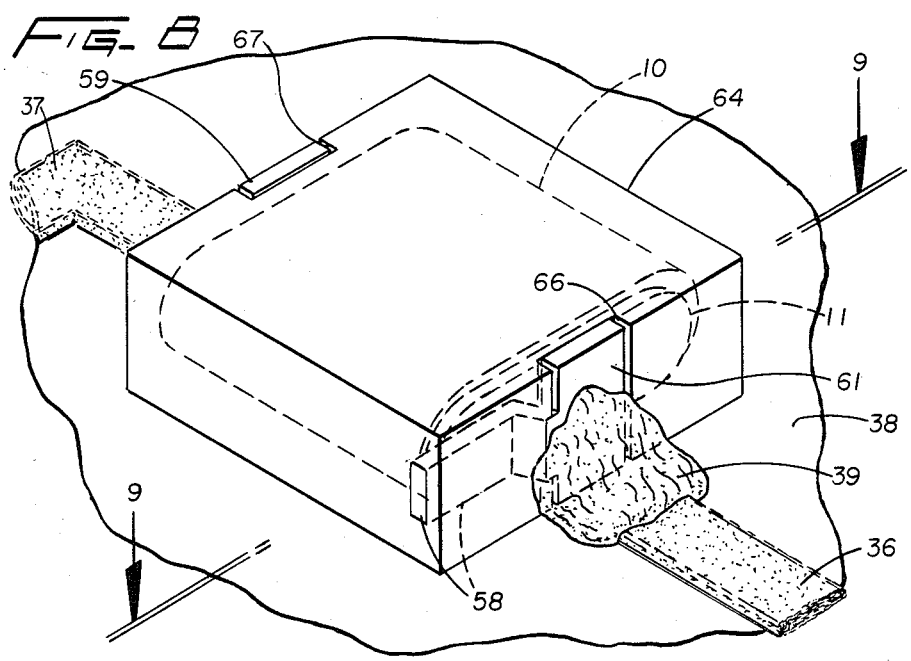
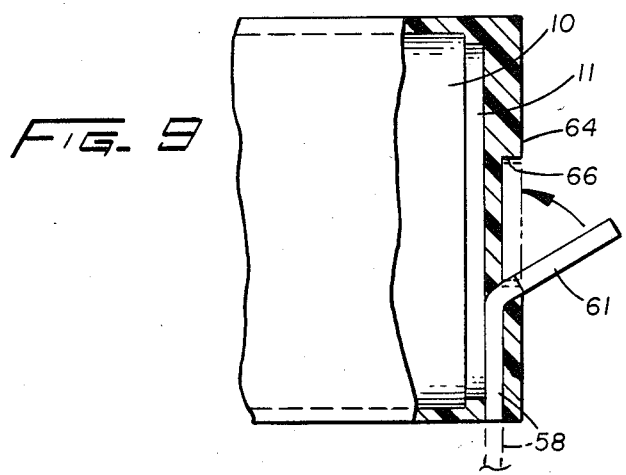

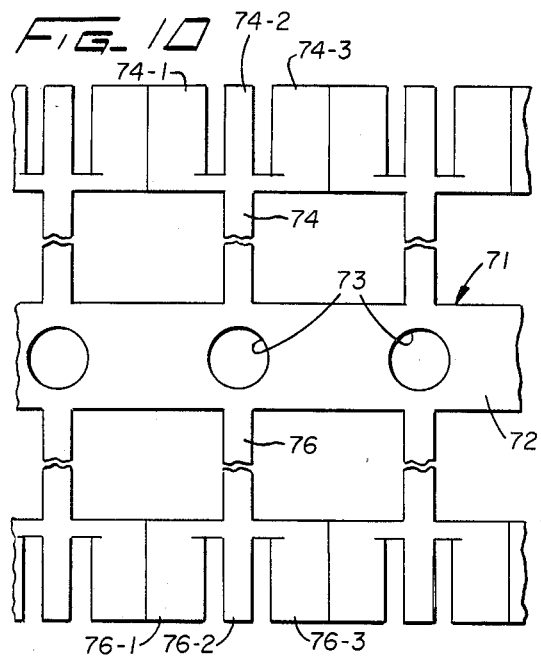
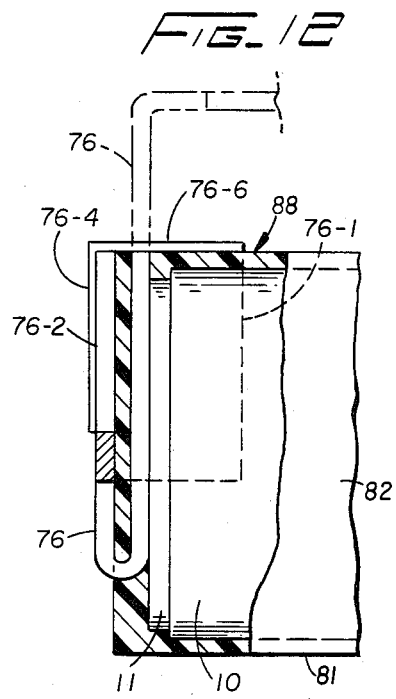
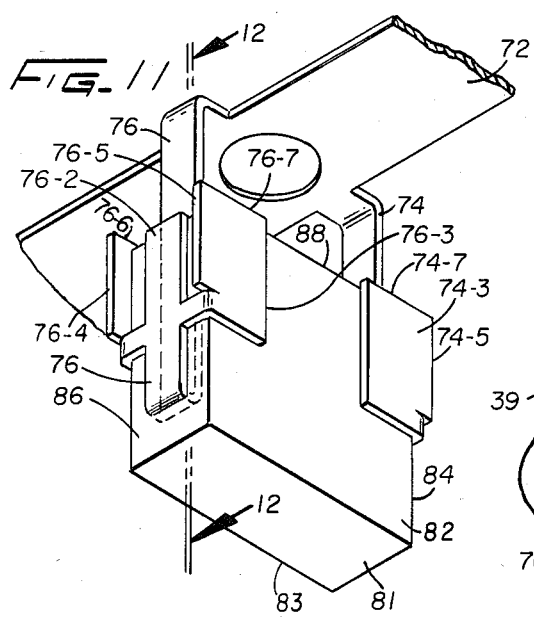
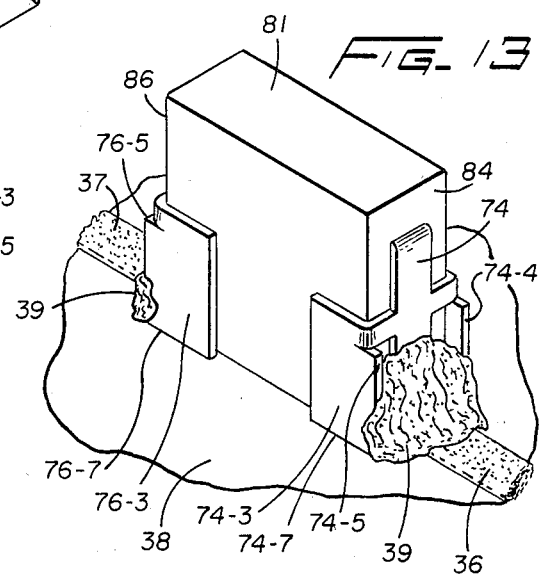

SURFACE MOUNTED ELECTRICAL COMPONENTS AND METHOD OF FABRICATION

FIELD OF INVENTION

This invention relates to electrical components having terminations that permit the bonding of the components to planar circuit members, and more particularly to component terminations that permit surface mounting of the components in a number of different orientations.

BACKGROUND OF THE INVENTION

Discrete electrical components are terminated in a number of ways that allow attachment to conductive pads or paths on a substrate. One of the more common attachment expedients resides in the use of components with wire-like projecting terminal leads which are passed through plated thru-holes formed in a circuit board and crimped into engagement with circuit elements formed on the underside of the board whereafter the board is passed through a solder wave to bond the leads to the circuit elements. In other instances, surface mounting techniques are utilized wherein the component terminations are in the form of thin metallic tabs projecting from the body of the component. These tabs may be bent to lie flat against one common surface of the component. Such component terminations are then solder bonded to conductive sites formed on a substrate. The substrate may be in the form of a printed circuit board or a ceramic sheet on which is laid a circuit pattern of a metallized film.

In the manufacture of surface mounted components such as disclosed in U.S. Pat. No. 3,550,228, a thin metal strip is subjected to blanking and bending operations in a progressive die to form a pair of termination tabs that project orthogonally from a pair of rail sections of the blanked strip. A component having a pair of opposed end electrodes is positioned between the termination tabs and these tabs are bonded to the electrodes by a soldering operation. In some instances, the soldering operation contemplates a precoat of solder, either on the termination tabs or on the electrodes, and the subsequent application of heat to reflow the solder and thus bond the solder to the electrodes. The assembly is severed from the metal strip leaving a pair of termination sections of the strip abutted against or positioned closely adjacent to one side of the body of the component. The terminated component may be surface mounted with the terminations bonded to planar metallic bonding sites formed on a substrate.

These prior art surface mountable components contemplate mounting the components in one orientation, that is the termination surfaces to be joined to the bonding site are in a single plane. It would be extremely useful if the components had a termination arrangement so that the components could be mounted in a number of different orientations. More specifically, in use of automatic assembly machines, it would be helpful if the components were provided with surface mounted terminations on both sides of the components so that automatic or robotic pickups could be utilized to pickup, transport and bond components that are in either of two different initial orientations. Further, if the components had a multi-surface arrangement of terminations, it would then be possible to mount the components in such a fashion as to minimize the amount of circuit substrate area occupied by the components.

SUMMARY OF INVENTION

The present invention contemplates, among other things, electrical components having unique terminal configurations that permit surface mounting on a planar circuit substrate in a number of different orientations.

More particularly, in one embodiment of the invention a rolled metallized film capacitor is encased in a plastic housing of rectangular configuration. Pairs of metallic tab-like terminals are bonded to the capacitor electrodes and are formed to lie on opposite major side walls of the housing as well as along opposite end walls of the housing. With this terminal construction, the component may be surface bonded to conductive sites on a planar circuit substrate in a number of different orientations, thus simplifying assembly as well as permitting maximum utilization of the space available on the circuit substrate.

BRIEF DESCRIPTION OF THE DRAWINGS

Other features and advantages of the invention will be apparent upon consideration of the following detailed description in conjunction with the drawing wherein:

FIG. 1 is a perspective showing of an existing commercial surface mountable component;

FIG. 2 is a perspective view of a rolled metallized film capacitor which is adapted to be provided with terminal configurations in accordance with the present invention;

FIG. 3 is a plan view of a thin sheet of metal stamped to provide a terminal configuration in accordance with one embodiment of the invention;

FIG. 4 is a perspective view of the stamped terminal strip following a number of bending operations together with an encased electrical component;

FIG. 5 is a partial side view of a component looking in the direction of the arrows 5—5 in FIG. 4 showing one terminal joined to an electrode of a component;

FIG. 6 is a perspective view illustrating the manner of bonding a terminated component to a pair of planar circuit elements;

FIG. 7 is a plan view of a thin sheet of metal stamped to provide a terminal configuration in accordance with a further embodiment of the invention;

FIG. 8 is a perspective view of a terminated component which is bonded to a pair of planar circuit sites in accordance with the second embodiment of the invention;

FIG. 9 is a side view taken along line 9—9 of FIG. 8 of a component, partially cut away, illustrating the manner of joining one of the terminals shown in FIG. 7 to an electrode of the component;

FIG. 10 is a plan view of a metal strip blanked to provide a terminal configuration in accordance with a third embodiment of the invention;

FIG. 11 is a perspective view of the blanked metal strip bent to provide terminals that are joined to the electrodes of an encased electrical component;

FIG. 12 is a side view of a component, partially cut away and looking in the direction of arrows 12—12 of FIG. 11, revealing the manner in which one terminal is joined to an electrode of the component; and FIG. 13 is a perspective view of a component with a terminal configuration of the third embodiment bonded to planar circuit sites on a substrate.

DETAILED DESCRIPTION

Referring to FIGS. 1 and 2 there is shown an electrical component 10 that is to be terminated in accordance with the invention. This component may be a rolled metallized film capacitor having end electrodes 11 and 12 constructed of heat fusible material to which terminals are bonded. In one commercial surface bondable electrical component, as shown in FIG. 1, one leg 13 of a U-shaped terminal 14 extends through an encasing housing 16 and is heat fused to an end electrode 11 of the component 10. A similar U-shaped terminal is mounted on the opposite end of the component. A bight section 18 of each terminal is flattened to provide a surface which is adapted to be bonded to planar metallized circuit sites formed on a substrate. It will be noted that both bonding flat surfaces 18 of the terminals are in the same plane thus limiting bonding of the component in a single orientation.

Encased capacitors of this type are, generally, fabricated by partially stamping a metallic strip to form the terminations and then bond the terminations to the end electrodes. Next, the housing is moved to a molding station where the housing 16 is formed about the component. In a final step, the terminals are severed from the strip and bent about the housing to provide the terminal configuration shown in FIG. 1.

Attention is directed to FIGS. 3, 4, 5 and 6 for a consideration of a first embodiment of the invention which provides a surface mountable electrical component that may be joined to planar circuit paths on a substrate in more than one orientation. First, a thin strip of metal 21 with good electrical and bondability characteristics is stamped in a die to provide the configuration shown in FIG. 3. The stamped strip is provided with a center carrier section 22 provided with holes 23 to enable the feeding of the strip through automatic stamping, bending, bonding, and molding apparatuses. As stamped, the sheet presents T-shaped blanks 24 and 26 having oppositely extending stem arms 24-1 and 26-1 joined to cross members made up of termination tabs 24-2, 24-3 and 26-2, 26-3. Short strut-like sections 24-4 and 26-4 project as continuations of the arms into the spaces between the associated tabs.

In fabrication of the terminated component, the arms 24-1 and 26-1 are bent upwardly as shown in FIG. 4 and a component 10 is interposed between the arms. The arms are bonded to the component end electrodes 11 and 12 (see also FIG. 5) by any suitable means such as be pretinning a portion of the arms and then applying heat to the arms. If the end electrodes 11 are composed of a heat fusible material then the arms may be abutted against the electrodes and subjected to heat to effectuate the bonding. Next, the bent arm sections 24-1 and 26-1 are subjected to a second bending operation so that the arms project orthogonally from the end electrodes. The strip with the bonded components is advanced into a molding device where a rectangular case or housing 31 is formed about the component. Subsequent to the molding operation, the assembly is moved into a further bending apparatus where the projecting sections of the arms of 24-1 and 26-1 are bent to lay flat against opposite end walls of the housing. Following this bending operation, a further bending operation is initiated to bend the series of tabs 24-2, 24-3 and 26-2, 26-3 about the corners of the housing into engagement with opposite major side walls of the housing. It will be noted that the strip 21 is slit and the tabs are sized so that small ledge sections 32 and 33 of each set of tabs project slightly beyond the end walls of the housing. As a final step, the arms 24-1 and 26-1 are sheared at a juncture 34 (see FIG. 5) with the underside of the housing 31.

The now completed end terminated electrical component may be surface mounted in either one of two orientations to planar circuit elements on a substrate. One such mounting is shown in FIG. 6 where the planar circuit elements are shown as separated, discrete circuit paths 36 and 37 on a substrate 38 which may be a phenolic board or a thin ceramic slab or slice. In the FIG. 6 illustration, the bonding is accomplished with globs of solder paste 39 which engages the ledge section 32 and the strut-like section 26-4 of the terminal tab 26-2. In other instances, the component may be turned over and the solder paste may be placed on end sections of the circuit elements 36 and 37 to be engaged by the planar surfaces of tabs 24-3 and 26-3.

This embodiment of the invention may be further modified to provide three pairs of terminals for mounting the component in three different orientations on the substrate. In this instance, the arms 24-1 and 26-1 are severed along dashed lines 41 and 42 and bent in opposite directions as indicated by the dashed arrows 43 and 44. As a result, two additional terminals, one which designated by reference numeral 46 and shown in dashed line in FIG. 5, are provided by these bent sections of the arm which permit mounting of the components with the terminals 46 abutted against and bonded to end sections of the circuit paths 36 and 37.

A further embodiment of the invention is disclosed in FIGS. 7, 8 and 9 and again a component 10 is terminated in such a fashion so as to permit mounting on planar circuit paths in two different orientations. A thin metal strip 51 is blanked in a stamping die to provide the configuration shown in FIG. 7. More particularly, the strip is stamped to form a center feed runner 52 with feed holes 53. The stamping is such that two sets of T-shaped terminals 54 and 56 are formed with stems 57 and 58 and cross members 59 and 61.

Assembly of the terminated component is similar to that described in respect to the embodiment of the invention shown in FIGS. 3–6. The initial bending operation bends the T-shaped terminals 54 and 56 downwardly from the plane of the strip 51. The cross members 59 and 61 together with sections of the respective stems 57 and 58 are bent outwardly to project angularly of the main portions of the stems 57 and 58 as shown in FIG. 9. The unbent sections of the stems are bonded to end electrodes 11 and 12 of a component 10. The assembled termination strip 51 and the component 10 are advanced into a molding apparatus where a housing 64 is formed about the component 10 with end walls encasing portions of the stems of the T-shaped terminals. The housing is molded with recesses 66 and 67. The cross members 61 and 59 are then bent to be nested within the recesses 66 and 67 with the end sections of the cross members aligned with or projecting slightly above the surfaces of the opposed side walls of the housing. The portions of the stems 57 and 58 projecting from the housing 64 are sheared leaving the completed terminated component.

This encased and terminated component may now be positioned with either major side wall abutted against the substrate 38 so that the terminals 59 and 61 rest against the discrete circuit paths 36 and 37. Again globs 39 of solder paste may be utilized to bond the terminals 59 and 61 to the respective circuit paths 37 and 36.

Referring to FIGS. 10, 11, 12 and 13 for consideration of a still further embodiment of the invention, wherein a termination configuration is provided that will again permit the mounting of an electrical component in three different oreintations. In this instance, a thin metal strip 71 is blanked to form a center section 72 with feed holes 73. Aligned pairs of ties 74 and 76 are formed as stems of generally T-shaped stampings. The cross members associated with the T-stems 74 are notched to provide three termination sections or tabs 74-1, 74-2 and 74-3, while the cross members associated with the stem 76 are notched to provide termination sections or tabs 76-1, 76-2 and 76-3.

In the manufacture of these terminated and encased components, the stems 74 and 76 are bent orthogonally from the plane of the sheet 71. The stems are further bent at 90° angles so that the tabs 74-1, -2, and -3 and 76-1, -2 and -3 project in opposite directions from the stems 74 and 76. The components 10 are then bonded to the stems. Next, the assembled strip and components are moved to a molding facility where the components are encased in a plastic housing 81. Following the molding of a housing, each assembly is moved into a final bending apparatus where the stems 74 and 76 are bent against opposite end sections of the housing whereafter the outer tabs 74-1 and 74-3 and the outer tabs 76-1 and 76-3 are bent around opposed major side walls 82 and 83 of the housing as shown in FIG. 11. After these steps, the stems 74 and 76 are sheared along lines at the junctures with the housing 81.

It will be noted that the tabs 74-1 and 74-3 are initially shaped; slit subsequently bent to have edge sections 74-4 and 74-5 that project beyond an end wall 84 of the housing. The tab 76-1 and 76-3 are formed in a like manner to provide edge sections 76-4 and 76-5 which project beyond the opposite end wall 86 of the housing. In addition, the tabs 74-1 and 74-3 are shaped so that when these tabs are bent around the side walls 82 and 83, feet sections 74-6 and 74-7 project beyond a bottom 88 of the housing 81. In a like manner, the tabs 76-1 and 76-3 are shaped so that when these tabs are bent around the side walls 82 and 83, feet sections 76-6 and 76-7 project beyond the bottom 88 of the housing.

FIG. 13 illustrates an encased component bonded to discrete circuit paths 36 and 37 in a vertical orientation. In this instance, the discrete circuit paths 36 and 37 may be thick film circuits bonded to a ceramic substrate 38. In assembly of the terminated capacitor, the projecting feet sections 74-6 and 74-7 straddle the circuit path 36 and rest against the substrate 38. In a like manner, the projecting feet sections 76-6 and 76-7 straddle the circuit path 37 and rest against the substrate 38. It may be also appreciated that the oppositely projecting pairs of edge sections 74-4, 74-5 and 76-4, 76-5 of the tabs provide pockets to receive globs 39 of solder.

In other assembly operations, the terminated component may be laid on either major side wall with a pair of tabs 74-1 and 76-1 or 74-3 and 76-3 abutted against the circuit paths. In this mode of assembly, the solder paste may be interposed between the outer surfaces of the tabs and the circuit paths. In the alternative, the solder paste may be applied as globs to overlay the pairs projecting edge sections 74-4, 74-5 or 76-4, 76-5 of the tabs to engage and bond against the center tabs 74-2 and 76-2 thereby insuring good electrical connections between the circuit paths and the terminations.

What is claimed is:

1. An electrical component assembly which comprises:
   an electrical device having electrodes on opposite ends;
   a housing encasing said electrical device and having a bottom wall, two end walls, and two opposed side walls; and
   a pair of T-shaped terminals, each of which includes a stem section bonded to a separate one of said electrodes and extending through one of said end walls to a cross member which extends across said one of said end walls with end sections exposed on the opposite side walls of said housing so that the electrical component assembly exhibits a multi-surface plurality of pairs of electrical terminations adapted for the surface mounting thereof in a plurality of different orientations, whereby said plurality of pairs of electrical terminations include end portions of the stem sections proximate to the bottom wall, the exposed end sections of the cross members on one of the side walls of the housing, and the exposed end sections of the cross members on the other side wall of the housing.

2. An electrical component assembly as defined in claim 1 wherein said side walls have opposed edge slots, and said end sections of said cross members terminate at the outer surfaces of said opposed side walls.

3. An electrical component assembly as defined in claim 1 where said cross members are bent to overlay said opposed side walls.

4. An electrical component assembly as defined in claim 1 wherein each of said cross members is slotted to provide a terminal section which extends along the outer surface of an end wall to said bottom wall.

5. An electrical component assembly as defined in claim 4 wheein each of said cross members extend along and project from said side walls to form a pocket with one of said end walls.

6. An electrical component assembly as defined in claim 5 wherein each of said cross members extend along and project from said side walls to overhang said bottom wall to provide a pair of feet.

7. An electrical component assembly as defined in claim 1 wherein each of said stem sections extends along one of said end walls and through the bottom wall with its end portion bent into engagement with said bottom wall.

8. A capacitor assembly, which comprises:
   a rolled metallized film capacitor having opposed fusible end electrodes;
   an insulating plastic box encasing said capacitor with the end electrodes facing opposed end walls of said plastic box, said box having a bottom wall and a pair of side walls joining said end walls; and
   a pair of terminals, each of said terminals including a stem section joined to a discrete one of said end electrodes and a cross section extending in opposite directions from said stem section to a pair of tab sections positioned against said pair of side walls so that the capacitor assembly exhibits three pairs of electrical terminations respectively located on different outside surfaces of the box and adapted for the surface mounting thereof in a plurality of different orientations, whereby said three pairs of terminations include two end portions of the stem sections proximate to the bottom wall, one pair of tab sections positioned against one of the side walls, and the other pair of tab sections positioned against the other side wall of the box.

9. A method of fabricating a multi-surface electrically terminated electrical component which comprises:
stamping a metal strip to form a center section with T-sections radiating from the center section, said T-sections having stem sections joined between said center section and a cross section forming a pair of termination tabs;
bending the stem sections to extend at right angles and in the same direction from said center section;
bonding said stem sections to electrodes of an electrical device interposed between said stem sections;
bending the cross sections to project orthogonally from the electrodes and the stem sections;
forming a housing about the electrical device and the stem sections bonded thereto;
bending the termination tabs of said cross sections about opposite sides of the housing to form two pairs of surface mountable electrical terminations on opposite sides of the housing; and
severing the stem sections from the center section.

10. A method as defined in claim 9 which further includes
the step of bending the severed stem sections in opposite directions against the underside surface of the housing to form a third pair of surface mountable electrical terminations.

11. A method as defined in claim 9 wherein the severing step includes shearing the stem sections at a juncture with the underside surface of the housing.

* * * * *